(12) United States Patent
Yanamandra et al.

(10) Patent No.: US 11,531,070 B2
(45) Date of Patent: Dec. 20, 2022

(54) SHORT DETECTION CIRCUIT

(71) Applicant: TEXAS INSTRUMENTS INCORPORATED, Dallas, TX (US)

(72) Inventors: Satya Someswara Kaushik Yanamandra, Duluth, GA (US); Soumya Chandramouli, Atlanta, GA (US); Michael Shin-Chyr Lu, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 73 days.

(21) Appl. No.: 16/746,796

(22) Filed: Jan. 17, 2020

(65) Prior Publication Data
US 2021/0223330 A1 Jul. 22, 2021

(51) Int. Cl.
| | |
|---|---|
| *G01R 31/52* | (2020.01) |
| *H03K 5/24* | (2006.01) |
| *G01R 19/165* | (2006.01) |
| *H03H 11/28* | (2006.01) |
| *H04B 1/04* | (2006.01) |
| *H04B 1/16* | (2006.01) |

(52) U.S. Cl.
CPC ....... *G01R 31/52* (2020.01); *G01R 19/16576* (2013.01); *H03H 11/28* (2013.01); *H03K 5/24* (2013.01); *H04B 1/04* (2013.01); *H04B 1/16* (2013.01)

(58) Field of Classification Search
None
See application file for complete search history.

(56) References Cited

U.S. PATENT DOCUMENTS

| | | | |
|---|---|---|---|
| 2005/0094737 A1 | 5/2005 | Vorenkamp | |
| 2008/0316930 A1 | 12/2008 | Xu et al. | |
| 2009/0146685 A1* | 6/2009 | Kim | H03K 19/0005 326/33 |
| 2009/0309611 A1 | 12/2009 | Butler et al. | |

OTHER PUBLICATIONS

International Search Report in corresponding PCT Application No. PCT/US2021/013794, dated Apr. 29, 2021 (2 pages).

* cited by examiner

*Primary Examiner* — Jas A Sanghera
(74) *Attorney, Agent, or Firm* — John R. Pessetto; Frank D. Cimino

(57) ABSTRACT

Aspects of the present disclosure provide for a circuit. In at least some examples, the circuit includes an output node at which a voltage for transmission via a differential conductor is present. The circuit further includes a first pull-up network coupled between a voltage supply node and the output node and configured to include a first amount of resistance. The circuit further includes a second pull-up network coupled between a voltage supply node and the output node and configured to include a second amount of resistance. The circuit further includes a comparator having a first input terminal coupled to the output node, a second input terminal configured to receive a reference voltage, and an output terminal configured to output a comparison result.

18 Claims, 7 Drawing Sheets

US 11,531,070 B2

SHORT DETECTION CIRCUIT

SUMMARY

Aspects of the present disclosure provide for a circuit. In at least some examples, the circuit includes an output node at which a voltage for transmission via a differential conductor is present. The circuit further includes a first pull-up network coupled between a voltage supply node and the output node and configured to include a first amount of resistance. The circuit further includes a second pull-up network coupled between a voltage supply node and the output node and configured to include a second amount of resistance. The circuit further includes a comparator having a first input terminal coupled to the output node, a second input terminal configured to receive a reference voltage, and an output terminal configured to output a comparison result.

Other aspects of the present disclosure provide for a method. In at least some examples, the method includes receiving a common mode voltage on which a transmission on a differential conductor is at least partially based. The method further includes enabling a first pull-up network coupled to the differential conductor. The method further includes generating a comparison result indicating a presence of a fault on the differential conductor, by comparing a voltage present at the differential conductor to a reference voltage after a first period of time, when a resistance of the pull-up network is greater than a resistance associated with the differential conductor. The method further includes generating the comparison result indicating no fault on the differential conductor, by comparing the voltage present at the differential conductor to the reference voltage, when the resistance of the pull-up network is less than the resistance associated with the differential conductor.

Other aspects of the present disclosure provide for a system. In at least some examples, the system includes a transmitter comprising a fault detection circuit. The fault detection circuit comprises an output node at which a voltage for transmission via a differential conductor is present, a first pull-up network coupled between a voltage supply node and the output node, a second pull-up network coupled between a voltage supply node and the output node, and a comparator having a first input terminal coupled to the output node, a second input terminal configured to receive a reference voltage, and an output terminal configured to output a comparison result. The system also includes a receiver comprising a termination circuit. The system further includes the differential conductor. The differential conductor comprises a positive conductor coupling the output node to the receiver and configured to couple to the fault detection circuit and the termination circuit and a negative conductor coupling the transmitter to the receiver and configured to couple to the fault detection circuit and the termination circuit.

BRIEF DESCRIPTION OF THE DRAWINGS

For a detailed description of various examples, reference will now be made to the accompanying drawings in which.

DETAILED DESCRIPTION

Figure 1:
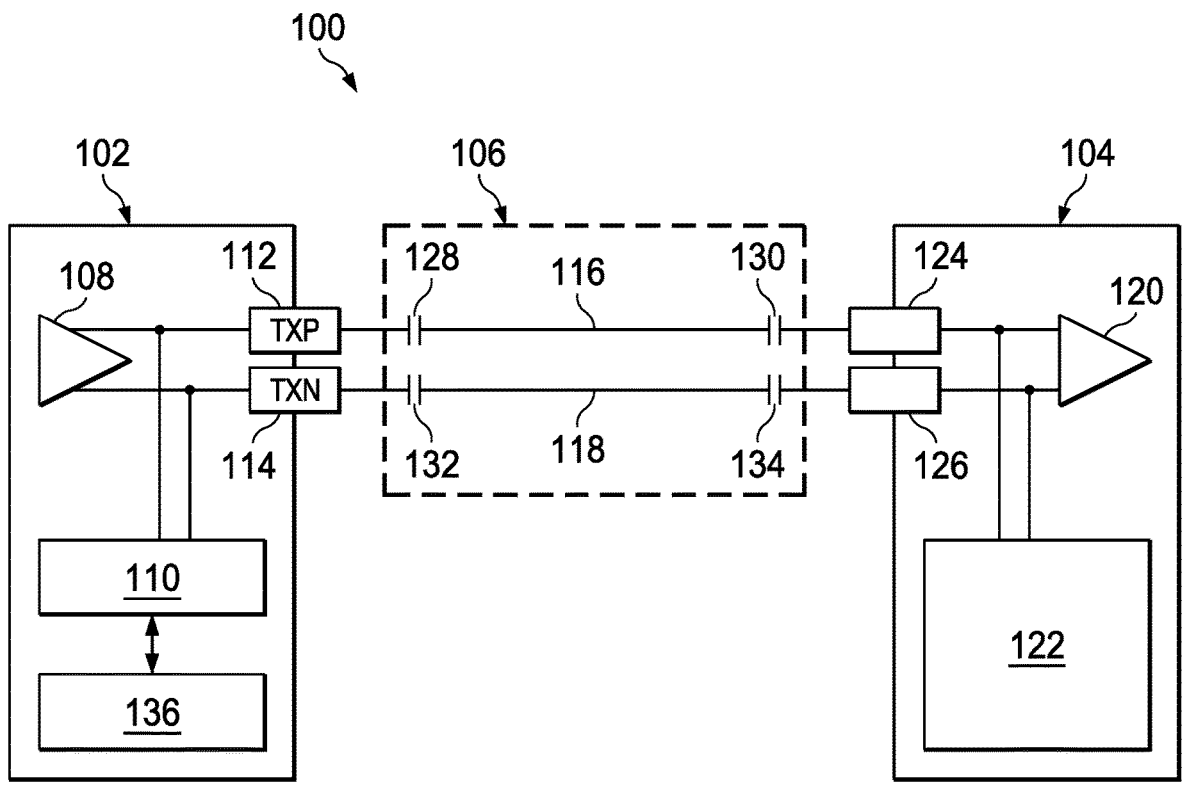
FIG. 1 shows a block diagram of an illustrative system in accordance with various examples.

In modern circuit design, competing interests of increasing feature sets and decreasing physical size, and therefore component cost, often occur. For example, in a system that includes a differential conductor (e.g., having positive and negative differential signal lines), it is sometimes desirable to determine whether the differential conductor is shorted to a voltage supply (VDD) or a ground (GND) node. However, at least some circuit implementations that include differential conductors also include alternating current (AC) decoupling capacitors, preventing access to direct current (DC) information associated with the differential conductor. In at least some implementations, determining a termination status (e.g., valid termination or short) of the differential conductor is complicated, or made more expensive, without access to that DC information associated with the differential conductor. For example, one solution includes adding a pin (e.g., an input/output (I/O) interface) to the circuit to enable DC voltage sensing on the opposite side of an AC coupling capacitor (e.g., a side of the AC coupling capacitor that is coupled to the differential conductor). However, this solution increases a physical size of the circuit and therefore a cost of the circuit, making it undesirable for at least some circuit use cases.

At least some aspects of the present disclosure provide for a circuit. The circuit is, in some examples, a termination status determination circuit. The circuit, in at least some examples, includes functionality that enables the circuit to determine whether a differential conductor is validly terminated (e.g., terminated by a 50 ohm ($\Omega$) or other specified resistance) or is shorted (e.g., a resistance of less than about 10$\Omega$ is present). At least some implementations of the circuit further include functionality to distinguish between a short between positive and negative conductors of the differential conductor and a short between one of the positive or negative conductor of the differential conductor and VDD or GND. The circuit achieves the above functionality, at least partially, according to a two-step process by implementing a pull-up network with multiple resistance values. At the first step, the circuit determines whether the positive or negative conductor of the differential conductor is in a high-impedance (high-Z) state or low impedance. At the second step, the circuit determines whether the positive or negative conductor of the differential conductor is terminated with an expected resistance (e.g., such as about 50$\Omega$) or some other resistance less than the expected resistance. In this way, the circuit determines whether the positive or negative conductor of the differential conductor is in the high-Z state. The circuit further determines whether the positive or negative conductor of the differential conductor is terminated with some other resistance less than the expected resistance, and in such a circumstance determines that a short exists for that respective one of the positive or negative conductor of the differential conductor.

Turning now to FIG. 1, a block diagram of an illustrative system 100 is shown. At least some implementations of the system 100 include a transmitter 102 and a receiver 104 communicatively coupled via a differential conductor 106. In this way, the system 100 is representative of a plurality of devices, including devices in which the transmitter 102 and the receiver 104 are both implemented in the same device and devices that include only one of the transmitter 102 or the receiver 104. In at least some examples, the system 100 is representative of, or is implemented in, an automobile or other transportation vehicle (e.g., airplane, boat, bus, truck, etc.).

In at least one implementation, the transmitter 102 includes a driver 108 and a fault detection circuit 110. The driver 108 includes a first output coupled to a first output terminal 112 of the transmitter 102 and a second output coupled to a second output terminal 114 of the transmitter 102. The differential conductor 106 includes a positive conductor 116 and a negative conductor 118. The receiver 104 includes a receiver front end 120 and an input termination circuit 122. The receiver front end 120 includes a first input terminal coupled to a first input terminal 124 of the receiver 104 and a second input terminal coupled to a second input terminal 126 of the receiver 104. The first output terminal 112 is coupled to the positive conductor 116 via a capacitor 128. The first input terminal 124 is coupled to the positive conductor 116 via a capacitor 130. The second output terminal 114 is coupled to the negative conductor 118 via a capacitor 132. The second input terminal 126 is coupled to the negative conductor 118 via a capacitor 134.

During normal operation of the system 100, the input termination circuit 122 terminates each of the positive conductor 116 and the negative conductor 118 with a specified amount of resistance. In at least some examples, that resistance is approximately equal to 50Ω. In other examples, that resistance is determined and set according to applicable industry standards or design decisions for the system 100. The following discussion is made with reference to the first output terminal 112 and the positive conductor 116. However, similar functionality applies with respect to the second output terminal 114 and the negative conductor 118. To determine whether a fault exists in the positive conductor 116, in at least some implementations the fault detection circuit 110 includes a single-step process that monitors the first output terminal 112. For example, the fault detection circuit 110 monitors the first output terminal 112 to determine whether a value of a signal present at the first output terminal 112 (referred to as TXP) exceeds, or does not exceed, a threshold after a specified period of time. The threshold is, in some examples, a reference voltage (VREF) received by the fault detection circuit 110. When TXP is greater than VREF at an expiration of the specified period of time, the fault detection circuit 110 determines that no fault exists in the positive conductor 116. When TXP is not greater than VREF at the expiration of the specified period of time, the fault detection circuit 110 determines that a fault exists in the positive conductor 116. The fault is either a short of the positive conductor 116 to VDD or to GND.

In at least some examples, the fault detection circuit 110 includes components suitable for implementing a voltage divider (not shown) at the positive conductor 116 such that a termination provided by the input termination circuit 122 is a bottom resistor of the voltage divider and one or more components of the fault detection circuit 110 are a top resistor of the voltage divider, with the first output terminal 112 being an output of the voltage divider. In at least some examples, the one or more components of the fault detection circuit 110 are switched components such that they are selectively switched into, or out of, a signal path to activate or deactivate the voltage divider. For example, in at least one example the one or more components include, or form, one or more pull-up networks. In some examples, the system 100 further includes a circuit 136 that controls at least some components of the fault detection circuit 110. In various implementations the circuit 136 takes various forms, such as a logic circuit, a digital circuit, a processor, a digital core, etc. In at last some examples, the circuit 136 generates and outputs a trigger signal (TRIG1) to the fault detection circuit 110 to control activation or deactivation of the voltage divider. In other examples, the circuit 136 outputs VREF to the fault detection circuit 110. In yet other examples, the fault detection circuit 110 includes an output terminal coupled to the circuit 136 to enable the circuit 136 to sample an output value of the circuit 136, for example, when TRIG1 changes in states.

In other examples, the fault detection circuit 110 includes a multi-step process that monitors the first output terminal 112 to determine whether a fault exists in the positive conductor 116. For example, the fault detection circuit 110 includes a plurality of switchably controlled components to selectively create a plurality of voltage dividers in the fault detection circuit 110. For example, at a first step, the fault detection circuit 110 determines whether the positive conductor 116 is in a high-Z state or is terminated. Existence of the high-Z state is, in some examples, evidence of a fault (e.g., an open circuit) and in other examples is merely informative (e.g., indicating that the receiver 104 is not ready to receive data). At a second step, the fault detection circuit 110 determines whether a termination of the positive conductor 116 is a valid termination made by the input termination circuit 122 or is a short to VDD or GND. The fault detection circuit 110 performs the determination at the first step by switching a first amount of resistance into a signal path to create a first voltage divider. The termination provided by the input termination circuit 122 is a bottom resistor of the first voltage divider and one or more components of the fault detection circuit 110 are a top resistor of the first voltage divider, providing the first amount of resistance, with the first output terminal 112 being an output of the first voltage divider.

In at least some examples, the capacitor 128 and capacitor 130 are coupled between the first output terminal 112 and the input termination circuit 122. Accordingly, in some examples the capacitor 128 and the capacitor 130 alter an impedance present on the positive conductor (e.g., as seen from the first output terminal 112 as the bottom resistor the first voltage divider). In addition, as discussed in greater detail elsewhere herein, the capacitor 128 charges based on a ratio of voltage of the top resistor to the bottom resistor, providing an indication when sampled after a predefined period of time as to whether the positive conductor 116 is validly terminated or shorted. Because the capacitor 128 and the capacitor 130 remain unchanging, they are generally not discussed herein with respect to the voltage divider(s) formed with an output at the first output node 112. The fault detection circuit 110 performs the determination at the second step by switching a second amount of resistance into a signal path to create a second voltage divider. The termination provided by the input termination circuit 122 is a bottom resistor of the second voltage divider and one or more other components of the fault detection circuit 110 are a top resistor of the second voltage divider, providing the second amount of resistance, with the first output terminal 112 being an output of the second voltage divider. In at least some examples, the fault detection circuit 110 receives a second trigger signal (TRIG2) from the circuit 136 for controlling switching of components for the second step in addition to receiving TRIG1 for controlling switching of components for the first step.

When the fault detection circuit 110 implements a two-step process, at the first step, when TXP is not greater than VREF at an expiration of the specified period of time, the fault detection circuit 110 determines that the positive conductor 116 is terminated. Similarly at the first step, when TXP is greater than VREF at the expiration of the specified period of time, the fault detection circuit 110 determines that the positive conductor 116 is in a high-Z state and invalidly terminated. At the second step, when TXP is greater than VREF at an expiration of the specified period of time, the fault detection circuit 110 determines that the positive conductor 116 is terminated. Similarly at the first step, when TXP is greater than VREF at an expiration of the specified period of time, the fault detection circuit 110 determines that no short exists in the positive conductor 116. When TXP is not greater than VREF at the expiration of the specified period of time, the fault detection circuit 110 determines that a short exists between the positive conductor 116 and VDD or GND.

In at least some examples, whether TXP exceeds VREF at the expiration of the specified period of time is determined at least partially according to a relationship of a pull-up resistance of the fault detection circuit 110 compared to a resistance present on the positive conductor 116. For example, the charging time is determined according to a capacitance of the capacitor 128, a resistance of the fault detection circuit 110, and a resistance present on the positive conductor 116. Because the capacitance of the capacitor 128 remains substantially constant, variation in the charging time of TXP can then be defined according to the relationship between the resistance of the fault detection circuit 110 and the resistance present on the positive conductor 116. For example, when the resistance of the fault detection circuit 110 is less than the resistance present on the positive conductor 116, TXP charges at a faster rate. When the resistance of the fault detection circuit 110 is greater than the resistance present on the positive conductor 116, TXP charges at a slower rate.

In some examples, the transmitter 102 and/or the circuit 136, or a device in which the transmitter 102 and/or circuit 136 is implemented, is unable to exert control over the receiver 104. However, in other examples the transmitter 102 and/or the circuit 136, or a device in which the transmitter 102 and/or circuit 136 is implemented, is able to exert control over the receiver 104. In such examples in which the receiver 102 is controllable by the transmitter 102 and/or the circuit 136, or a device in which the transmitter 102 and/or circuit 136 is implemented, the system 100 further includes functionality to determine whether a short exists between the positive conductor 116 and the negative conductor 118. In at least one implementation of short detection between the positive conductor 116 and the negative conductor 118, the receiver 104 is controlled to place the positive conductor 116 in the high-Z state and validly terminate the negative conductor 118. The fault detection circuit 110 then implements the first step of the two-step fault detection process to determine whether the positive conductor 116 is detected at the fault detection circuit 110 as being validly terminated despite the receiver 104 having placed the positive conductor 116 in the high-Z state. If the fault detection circuit 110 determines that the positive conductor 116 is validly terminated, the receiver 104 is next controlled to place the negative conductor 118 in the high-Z state and validly terminate the positive conductor 116. The fault detection circuit 110 then repeats the first step of the two-step fault detection process to determine whether the negative conductor 118 is detected at the fault detection circuit 110 as being validly terminated despite the receiver 104 having placed the negative conductor 118 in the high-Z state. When the fault detection circuit 110 determines that the negative conductor 118 is also validly terminated, the fault detection circuit 110 (or the circuit 136 based on one or more output signals of the fault detection circuit 110) determines that a short exists between the positive conductor 116 and the negative conductor 118. If either of the positive conductor 116 or the negative conductor 118 are determined by the fault detection circuity 110 to be in the high-Z state, the fault detection circuit 110 (or the circuit 136 based on one or more output signals of the fault detection circuit 110) determines that no short exists between the positive conductor 116 and the negative conductor 118.

Figure 2:
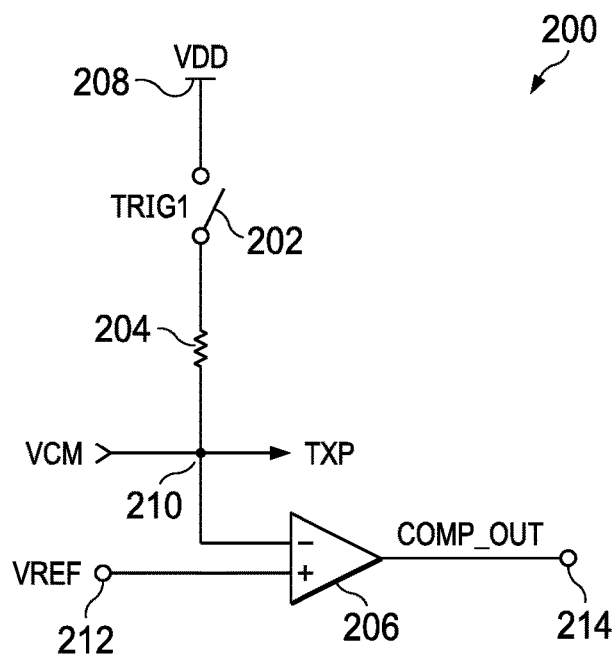
FIG. 2 shows a schematic diagram of an illustrative circuit in accordance with various examples.

Turning now to FIG. 2, a schematic diagram of an illustrative fault detection circuit 200 is shown. In at least some examples, the circuit 200 is suitable for implementation as a portion of the fault detection circuit 110 of the system 100 of FIG. 1. For example, the circuit 200 is suitable for implementation as a portion of the fault detection circuit 110 that detects a fault in the positive conductor 116. Another instance of the circuit 200 is further suitable for implementation as a portion of the fault detection circuit 110 that detects a fault in the negative conductor 118, in substantially a same manner as discussed herein with respect to the positive conductor 116. Alternatively, the circuit 200 is suitable for implementation as a portion of the fault detection circuit 110 that determines whether the positive conductor 116 (or alternatively, the negative conductor 118) is in a high-Z state. In at least one implementation, the circuit 200 includes a switch 202, a resistor 204, and a comparator 206. In at least some examples, the switch 202 is implemented as a solid-state switching device, such as a transistor, configured to receive, and be controlled at least partially according to, TRIG1. In other examples, the switch 202 is implemented as a mechanical switching device configured to receive, and be controlled at least partially according to, TRIG1. In at least one implementation of the circuit 200 in which an expected termination resistance of a conductor coupled to the node 210 is about 50Ω, the resistor 204 has a resistance of about 20Ω.

In an example architecture of the circuit 200, the switch 202 and the resistor 204 are coupled in series between a node 208 and a node 210. The switch 202 and the resistor 204, in at least some examples, are collectively referred to as a pull-up network. In at least some examples, the node 208 is a node at which VDD is present and the node 210 is an output node (e.g., such that the node 208 of the circuit 200 is analogous to the first output terminal 112 of the transmitter 102). While illustrated in FIG. 2 as the switch 202 coupling to the node 208 and the resistor coupling to the node 210, in some implementations this orientation is instead reversed. The comparator 206 has a first input terminal (e.g., a negative or inverting input terminal) coupled to the node 210 and a second input terminal (e.g., a positive or non-inverting input terminal) coupled to a node 212. An output terminal of the comparator 206 is coupled to a node 214. In at least some examples, VREF is received at the node 212 and an output signal COMP_OUT is provided at the node 214, where COMP_OUT indicates whether a fault (or high-Z state, depending on an implementation of the circuit 200) is detected in a conductor coupled to the node 210.

In an example of operation of the circuit 200, a signal is received at the node 210. In at least some examples, the signal is a common mode voltage (VCM) for transmission as TXP. In at least some examples, the signal does not include a differential component (e.g., such as when the fault detection of the present disclosure is performed at system startup, prior to the transmission of differential data). When the circuit 200 is disabled, the signal received at the node 210 is substantially unaltered and output as TXP also at the node 210. When the circuit 200 is enabled, such as when TRIG1 is asserted, the switch 202 activates, electrically coupling the resistor 204 to the node 208. When VDD is present at the node 208, the node 210 is pulled high (e.g., approaches a value of VDD) through the resistor 204 and the switch 202. VREF, in at least some examples, is a value greater than VCM but less than VDD. By knowing an expected termination resistance (such as about 50Ω) of a conductor coupled to the node 210, such as the positive conductor 116, over which TXP is transmitted, the circuit 200 determines whether the conductor is shorted to VDD or GND.

When the resistor 204 has a lesser amount of resistance than the expected termination resistance of the conductor over which TXP is transmitted, TXP increases in value to exceed VREF while TRIG1 is asserted. When the resistor 204 has a greater amount of resistance than the expected termination resistance of the conductor over which TXP is transmitted, TXP does not increase in value to exceed VREF while TRIG1 is asserted. In at least some examples, the value of resistance of the resistor 204 is selected such that the comparator 206 has a maximum margin (e.g., a margin enabling the comparator 206 to determine whether a condition is met) for both conditions of the conductor being validly terminated and the conductor being shorted to VDD or GND. In at least some examples, when the conductor over which TXP is transmitted is shorted to VDD or GND, a resistance present on the conductor is less than the resistance of the resistor 204. For example, the resistance present on the conductor is less than approximately 10Ω. Conversely, when the conductor over which TXP is transmitted is not shorted to VDD or GND and is instead validly terminated, the expected termination resistance of the conductor over which TXP is transmitted is present on the conductor. In at least one example, the resistance present on the conductor is greater than approximately 40Ω, or is approximately equal to about 50Ω. Based on the relationship between the resistance of the resistor 204 and the resistance present on the conductor, TXP increases in value. When the resistance of the resistor 204 is greater than the resistance present on the conductor, a majority of VDD is dropped across the resistor 204, resulting in a slow increase in value of TXP. Conversely, when the resistance of the resistor 204 is less than the resistance present on the conductor, a majority of VDD is dropped across the conductor, resulting in a more rapid increase in value of TXP.

For example, after a first edge transition of TRIG1 occurs, TRIG1 remains asserted for a predefined period of time determined at least partially according to the expected termination resistance of the conductor over which TXP is transmitted and a resistance of the resistor 204. In at least some examples, the predefined period of time is determined according to a resistor-capacitor (RC) time constant created by the resistor 204 and an AC coupling capacitor (e.g., the capacitor 128) coupled to the node 210, as well as a resistance present on the positive conductor 116. At a second edge transition of TRIG1, if TXP has increased in value to exceed VREF the circuit 200 determines that no short exists in the conductor because the resistance present on the conductor is greater than the resistance of the resistor 204. However, if at the second edge of TRIG1 TXP remains less than VREF, the circuit 200 determines that a short exists in the conductor because the resistance present on the conductor is less than the resistance of the resistor 204. The determination is made, in at least some examples, by the comparator 206 comparing TXP to VREF to generate COMP_OUT. In some examples, such as illustrated in FIG. 2, the comparator 206 is configured such that COMP_OUT is asserted when TXP is less than VREF and a short is detected. In other examples the polarity of the first and second input terminals of the comparator 206 is reversed from that shown in FIG. 2. Such that COMP_OUT is de-asserted when TXP is less than VREF. In at least some examples, the circuit 200 is coupled to the circuit 136 of FIG. 1. In such examples, the circuit 200 receives TRIG1 from the circuit 136 and provides COMP_OUT to the circuit 136. Further in such examples, the circuit 136 samples (e.g., records and/or stores) a value of COMP_OUT substantially concurrently with the second edge transition of TRIG1. In other examples, the circuit 136 samples the value of COMP_OUT at a time temporally adjacent to the second edge transition of TRIG1. For example, the circuit 136 samples the value of COMP_OUT slightly before or slightly after the second edge transition of TRIG1.

Figure 3A:
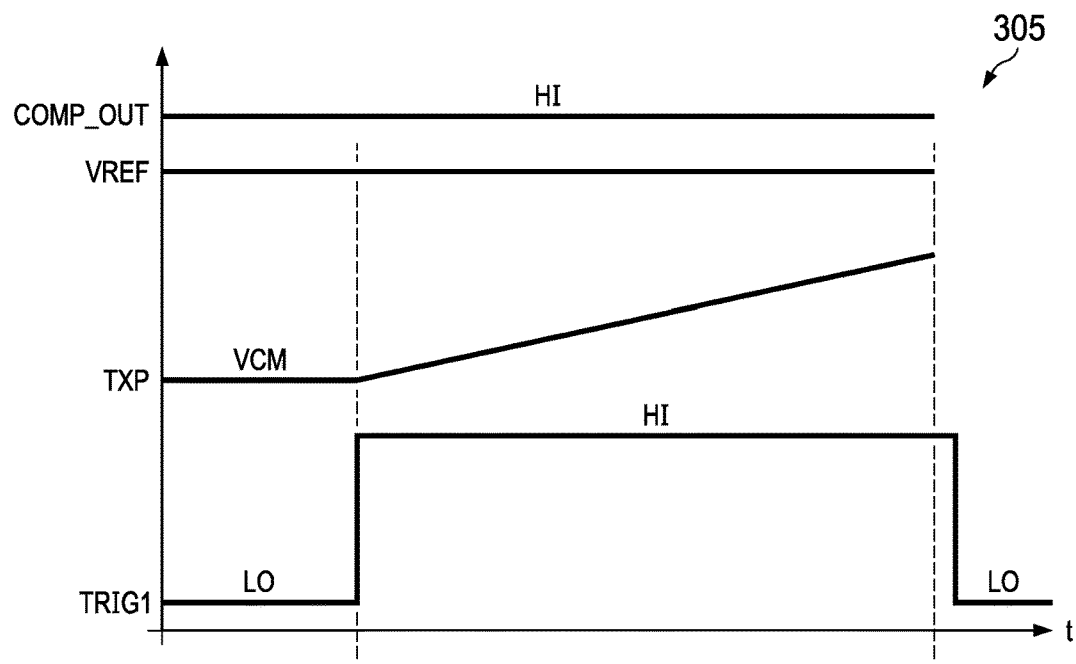
FIG. 3A shows a diagram of illustrative signal waveforms in accordance with various examples.
Figure 3B:
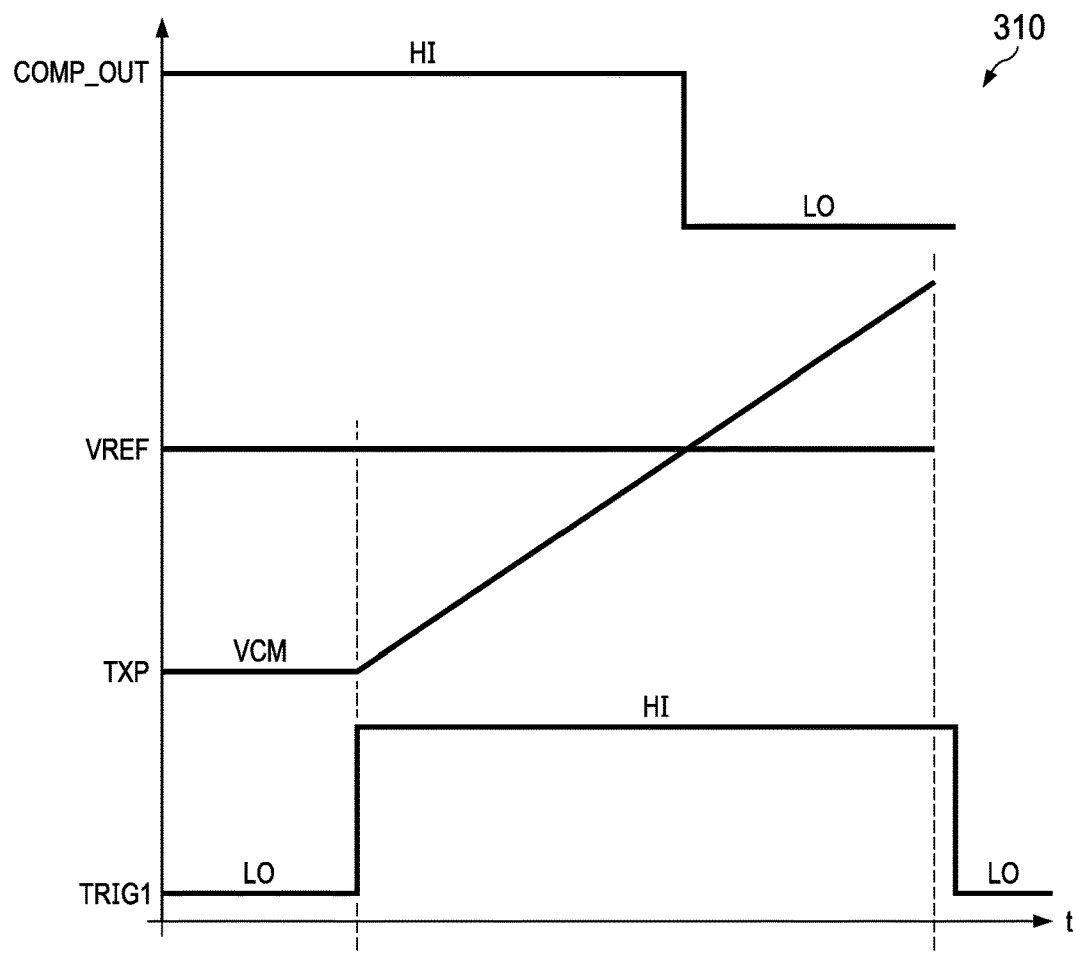
FIG. 3B shows a diagram of illustrative signal waveforms in accordance with various examples.

Turning now to FIGS. 3A and 3B, diagrams of illustrative signal waveforms are shown. In at least some examples, the diagram 305 is representative of at least some signals present in the system 100 of FIG. 1 and/or the circuit 200 of FIG. 2 when a short exists. Additionally, in at least some examples, the diagram 310 is representative of at least some signals present in the system 100 of FIG. 1 and/or the circuit 200 of FIG. 2 when no short exists (e.g., such as when a valid termination is present). Accordingly, at least some aspects of description of FIGS. 3A and/or 3B make reference to components and/or signals of FIG. 1 and/or FIG. 2. Furthermore, similar to the above discussion, FIGS. 3A and 3B are discussed with respect to the first output terminal 112, TXP, and the positive conductor 116. Waveforms for the second output terminal 114, a signal present at the second output terminal (referred to herein as TXN), and the negative conductor 118 are substantially similar to those illustrated in FIGS. 3A and 3B.

As shown in the diagram 305, when TRIG1 becomes asserted, TXP begins to increase in value. TRIG1 remains asserted for a predefined period of time determined at least partially according to values of VREF, VCM, and the resistance of the resistor 204. For example, TRIG1 remains asserted for a period of time sufficient to determine, based on a value of VCM and a value of TXP, whether the resistance of the resistor 204 is greater than or less than a resistance present on the positive conductor 116. The resistance present on the positive conductor 116 is less than the resistance of the resistor 204 when the positive conductor 116 is shorted to VDD or GND. When the resistance present on the positive conductor 116 is less than the resistance of the resistor 204, TXP remains less than VREF for a duration of time that TRIG1 is asserted and COMP_OUT remains de-asserted (in this example, at a logical high level, but in other examples at a logical low level).

As also shown in the diagram 310, when TRIG1 becomes asserted, TXP begins to increase in value. TRIG1 remains asserted for the predefined period of time, as discussed with reference to the diagram 305. The resistance present on the positive conductor 116 is greater than the resistance of the resistor 204 when the positive conductor 116 is validly terminated with a resistance greater than the resistance of the resistor 204 and/or not shorted to VDD or GND. When the resistance present on the positive conductor 116 is greater than the resistance of the resistor 204, TXP exceeds VREF prior to de-assertion of TRIG1 and COMP_OUT becomes asserted (in this example, set to a logical low level, but in other examples at a logical high level).

Figure 4:
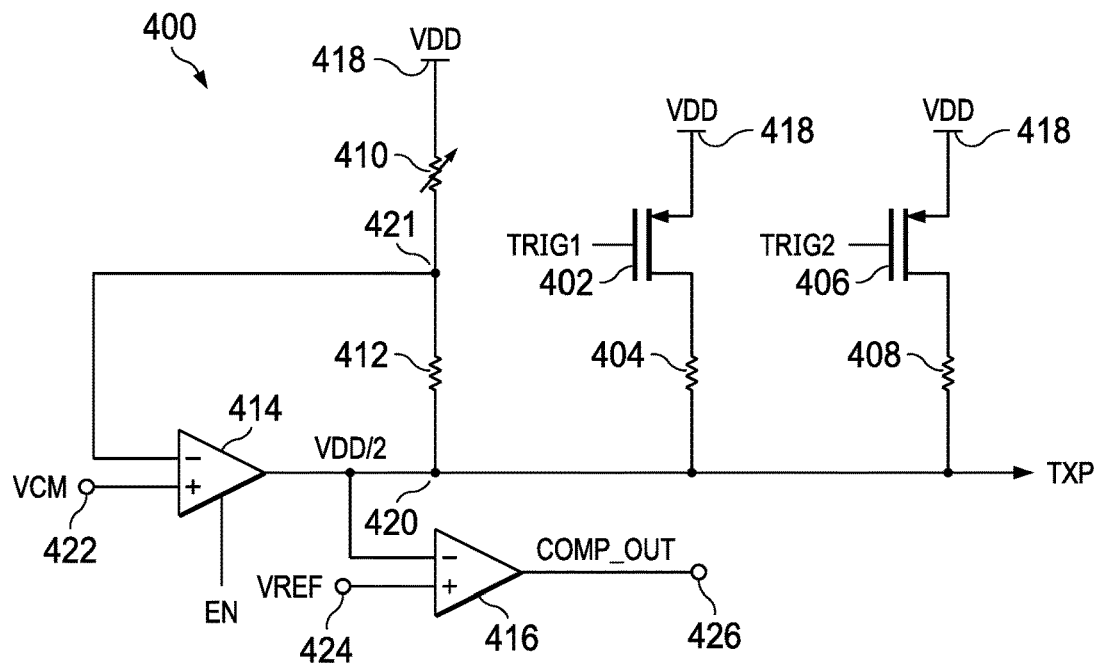
FIG. 4 shows a schematic diagram of an illustrative circuit in accordance with various examples.

Turning now to FIG. 4, a schematic diagram of an illustrative fault detection circuit 400 is shown. In at least some examples, the circuit 400 is suitable for implementation as at least a portion of the fault detection circuit 110 of the system 100 of FIG. 1. For example, the circuit 400 is suitable for implementation as a portion of the fault detection circuit 110 that detects a fault or high-Z state in the positive conductor 116. Another instance of the circuit 400 is further suitable for implementation as a portion of the fault detection circuit 110 that detects a fault or high-Z state in the negative conductor 118, in substantially a same manner as discussed herein with respect to the positive conductor 116. In at least one implementation, the circuit 400 includes a transistor 402, a resistor 404, a transistor 406, a resistor 408, a resistor 410, a resistor 412, an amplifier 414, and a comparator 416. The transistor 402 and the resistor 404, in at least some examples, are collectively referred to as a pull-up network. The transistor 406 and the resistor 408, in at least some examples, are also collectively referred to as a pull-up network. In various other examples, the transistor 402 and/or the transistor 406 is/are replaced by any other suitable and controllable switching device, such as a transistor of another process technology, a mechanical switch, etc.

In an example architecture of the circuit 400, the transistor 402 has a source terminal coupled to a node 418, a drain terminal coupled to a node 420 through the resistor 404, and a gate terminal configured to receive a trigger signal TRIG1. The transistor 406 has a source terminal coupled to the node 418, a drain terminal coupled to the node 420 through the resistor 408, and a gate terminal configured to receive a trigger signal TRIG2. The resistor 410 is coupled between the node 418 and a node 421 and the resistor 412 is coupled between the node 421 and the node 420. The amplifier 414 has a first input terminal (e.g., a negative or inverting input terminal) coupled to the node 421, a second input terminal (e.g., a positive or non-inverting input terminal) coupled to a node 422, and an output terminal coupled to the node 420. The comparator 416 has a first input terminal (e.g. a negative or inverting input terminal) coupled to the node 420, a second input terminal (e.g., a positive or non-inverting input terminal) coupled to a node 424, and an output terminal coupled to a node 426. In at least some examples, VDD is present at the node 418, VREF is received at the node 424, and COMP_OUT is output at the node 426, where COMP_OUT indicates whether a fault, or high-Z state, is detected in a conductor coupled to the node 420. Additionally, in at least some examples the node 422 is configured to receive a positive output of the driver 108 and the node 420 is analogous to the first output terminal 112 such that TXP is present at the node 420. Further, in at least some examples the resistor 410 is a controllable or otherwise programmable component having such that an amount of resistance of the resistor 410 is variable and selectable. In at least one implementation of the circuit 400 in which an expected termination resistance of a conductor coupled to the node 420 is about 50Ω, the resistor 404 has a resistance of about 1,000Ω and the resistor 408 has a resistance of about 20Ω.

In an example of operation of the circuit 400, VCM is received at the node 422. The resistor 410 and the resistor 412 form a voltage divider between the node 418 and the node 420 with an output at the node 421. The amplifier 414 is, in at least some examples, an operational amplifier that together with the resistor 410 and the resistor 412 drives the node 420 to a value of approximately VDD/2. In other examples, the amplifier 414, resistor 410, and resistor 412 drive the node 420 to any other suitable value based at least partially on VCM. The amplifier 414 drives the node 420 to VDD/2, in at least some examples, when the amplifier 414 is enabled. The amplifier 414 is enabled, in some examples, when a received enable signal (EN) is asserted. EN is asserted, in some examples, when TRIG1 and TRIG2 are each de-asserted and EN is de-asserted when either TRIG1 or TRIG2 is asserted. In at least some examples, each of EN, TRIG1, and TRIG2 are received from the circuit 136 and COMP_OUT is output to the circuit 136.

When TRIG1 and TRIG2 are each de-asserted, the fault detection of the circuit 400 is disabled and VDD/2 is output as TXP. When TRIG1 is asserted, a first step of a two-step fault detection process of the circuit 400 is active and both EN and TRIG2 are de-asserted. When the first step of the fault detection process is active, the circuit 400 determines whether a conductor coupled to the node 420 (e.g., such as the positive conductor 116) is in a high-Z state or is terminated. In at least some implementations, both a valid termination with an expected termination resistance for the conductor coupled to the node 420 and a short of the conductor coupled to the node 420 are determined to be a termination at the first step of the fault detection process.

When TRIG1 is asserted, the transistor 402 activates, electrically coupling the resistor 404 to the node 418. When VDD is present at the node 418, the node 420 is pulled high (e.g., approaches a value of VDD) through the resistor 404 and transistor 402. VREF, in at least some examples, is a value greater than VDD/2 but less than VDD. By knowing an expected termination resistance (such as about 50Ω) of a conductor coupled to the node 420, such as the positive conductor 116, over which TXP is transmitted, the circuit 400 determines whether the conductor is in the high-Z state or is terminated. For example, when the resistor 404 has a lesser amount of resistance than the expected termination resistance of the conductor, TXP increases in value to exceed VREF while TRIG1 is asserted. When the resistor 404 has a greater amount of resistance than the expected termination resistance of the conductor over which TXP is transmitted, TXP does not increase in value to exceed VREF while TRIG1 is asserted. In at least some examples, when the conductor over which TXP is terminated, a resistance present on the conductor is less than the resistance of the resistor 404. For example, the resistance present on the conductor is less than approximately 200Ω. Conversely, when the conductor over which TXP is transmitted is in the high-Z state, a resistance greater than the resistance of the resistor 204 is present on the conductor. For example, the resistance present on the conductor is greater than approximately 10,000Ω. Based on the relationship between the resistance of the resistor 404 and the resistance present on the conductor, TXP increases in value. A rate of that increase in value, in at least some examples, indicates whether a fault (or high-Z state) exists (e.g., the conductor is in a high-Z state or the conductor is shorted to VDD or GND). When the resistance of the resistor 404 is greater than the resistance present on the conductor, a majority of VDD is dropped across the resistor 404, resulting in a slow increase in value of TXP. Conversely, when the resistance of the resistor 404 is less than the resistance present on the conductor, a majority of VDD is dropped across the conductor, resulting in a more rapid increase in value of TXP.

For example, after a first edge transition of TRIG1 occurs, TRIG1 remains asserted for a predefined period of time determined at least partially according to the expected termination resistance of the conductor over which TXP is transmitted and a resistance of the resistor 404. At a second edge transition of TRIG1, if TXP has increased in value to exceed VREF the circuit 400 determines that the conductor is in the high-Z state because the resistance present on the conductor is greater than the resistance of the resistor 404. However, if at the second edge of TRIG1 TXP remains less than VREF, the circuit 400 determines that the conductor is terminated because the resistance present on the conductor is less than the resistance of the resistor 404. The determination is made, in at least some examples, by the comparator 416 comparing TXP to VREF to generate COMP_OUT. In some examples, such as illustrated in FIG. 4, the comparator 416 is configured such that COMP_OUT is asserted when TXP is less than VREF and a termination is detected. In other examples the polarity of the first and second input terminals of the comparator 416 is reversed from that shown in FIG. 4 such that COMP_OUT is de-asserted when TXP is less than VREF. In at least some examples, the circuit 400 is coupled to the circuit 136 of FIG. 1. In such examples, the circuit 400 receives TRIG1 from the circuit 136 and provides COMP_OUT to the circuit 136. Further in such examples, the circuit 136 samples (e.g., records and/or stores) a value of COMP_OUT substantially concurrently with the second edge transition of TRIG1. In other examples, the circuit 136 samples the value of COMP_OUT at a time temporally adjacent to the second edge transition of TRIG1. For example, the circuit 136 samples the value of COMP_OUT slightly before or slightly after the second edge transition of TRIG1.

After determining whether the conductor is terminated, TRIG1 is de-asserted, deactivating the transistor 402, and the first step of the fault detection process ends. To begin the second step of the fault detection process, TRIG2 is asserted. When TRIG2 is asserted, the transistor 406 activates, electrically coupling the resistor 408 to the node 418. When VDD is present at the node 418, the node 420 is pulled high (e.g., approaches a value of VDD) through the resistor 408 and transistor 406. By again knowing the expected termination resistance (such as about 50Ω) of the conductor coupled to the node 420, such as the positive conductor 116, over which TXP is transmitted, the circuit 400 determines whether the conductor is terminated by the expected termination resistance or is shorted to VDD or GND. For example, when the resistor 408 has a lesser amount of resistance than the expected termination resistance of the conductor over which TXP is transmitted, TXP increases in value to exceed VREF while TRIG2 is asserted. When the resistor 408 has a greater amount of resistance than the expected termination resistance of the conductor over which TXP is transmitted, TXP does not increase in value to exceed VREF while TRIG2 is asserted. In at least some examples, when the conductor over which TXP is transmitted is shorted to VDD or GND, a resistance present on the conductor is less than the resistance of the resistor 408. For example, the resistance present on the conductor is less than approximately 10Ω. Conversely, when the conductor over which TXP is transmitted is instead validly terminated, the expected termination resistance of the conductor over which TXP is transmitted is present on the conductor. In at least one example, the resistance present on the conductor is greater than approximately 40Ω, or is approximately equal to 50Ω, when the conductor is validly terminated. Based on the relationship between the resistance of the resistor 408 and the resistance present on the conductor, TXP increases in value. As discussed above, a rate of that increase in value, in at least some examples, indicates whether a fault or high-Z state exists. When the resistance of the resistor 408 is greater than the resistance present on the conductor, a majority of VDD is dropped across the resistor 408, resulting in a slow increase in value of TXP. Conversely, when the resistance of the resistor 408 is less than the resistance present on the conductor, a majority of VDD is dropped across the conductor, resulting in a more rapid increase in value of TXP.

For example, after a first edge transition of TRIG2 occurs, TRIG2 remains asserted for a predefined period of time determined at least partially according to the expected termination resistance of the conductor over which TXP is transmitted and a resistance of the resistor 408. At a second edge transition of TRIG2, if TXP has increased in value to exceed VREF the circuit 400 determines that no short exists in the conductor because the resistance present on the conductor is greater than the resistance of the resistor 408. However, if at the second edge of TRIG2 TXP remains less than VREF, the circuit 400 determines that a short exists in the conductor because the resistance present on the conductor is less than the resistance of the resistor 408. The determination is made, in at least some examples, by the comparator 416 comparing TXP to VREF to generate COMP_OUT. In some examples, the circuit 200 receives TRIG2 from the circuit 136 and the circuit 136 samples (e.g., records and/or stores) a value of COMP_OUT substantially concurrently with the second edge transition of TRIG2. In other examples, the circuit 136 samples the value of COMP_OUT at a time temporally adjacent to the second edge transition of TRIG2. For example, the circuit 136 samples the value of COMP_OUT slightly before or slightly after the second edge transition of TRIG2.

Figure 5A:
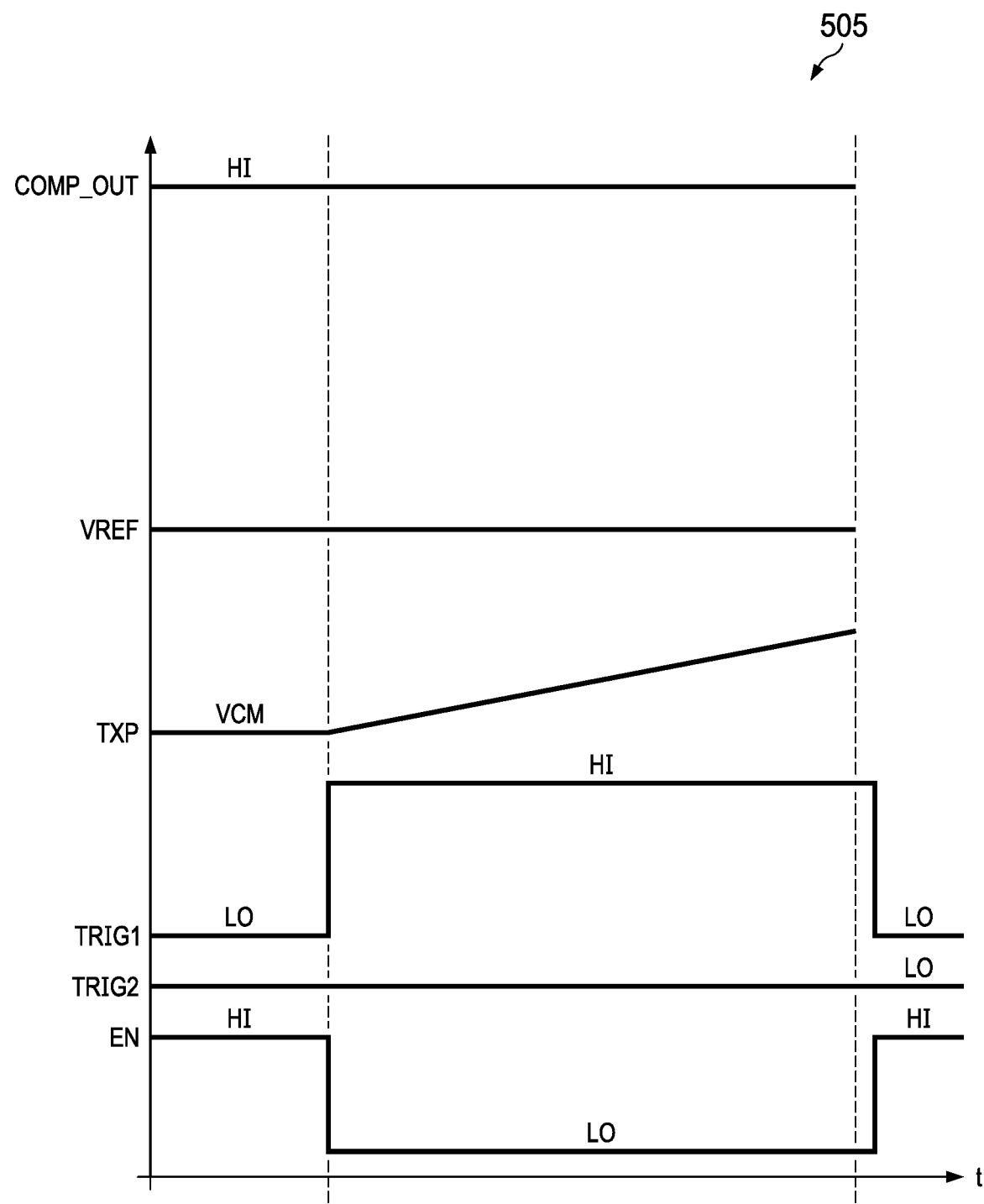
FIG. 5A shows a diagram of illustrative signal waveforms in accordance with various examples.
Figure 5B:
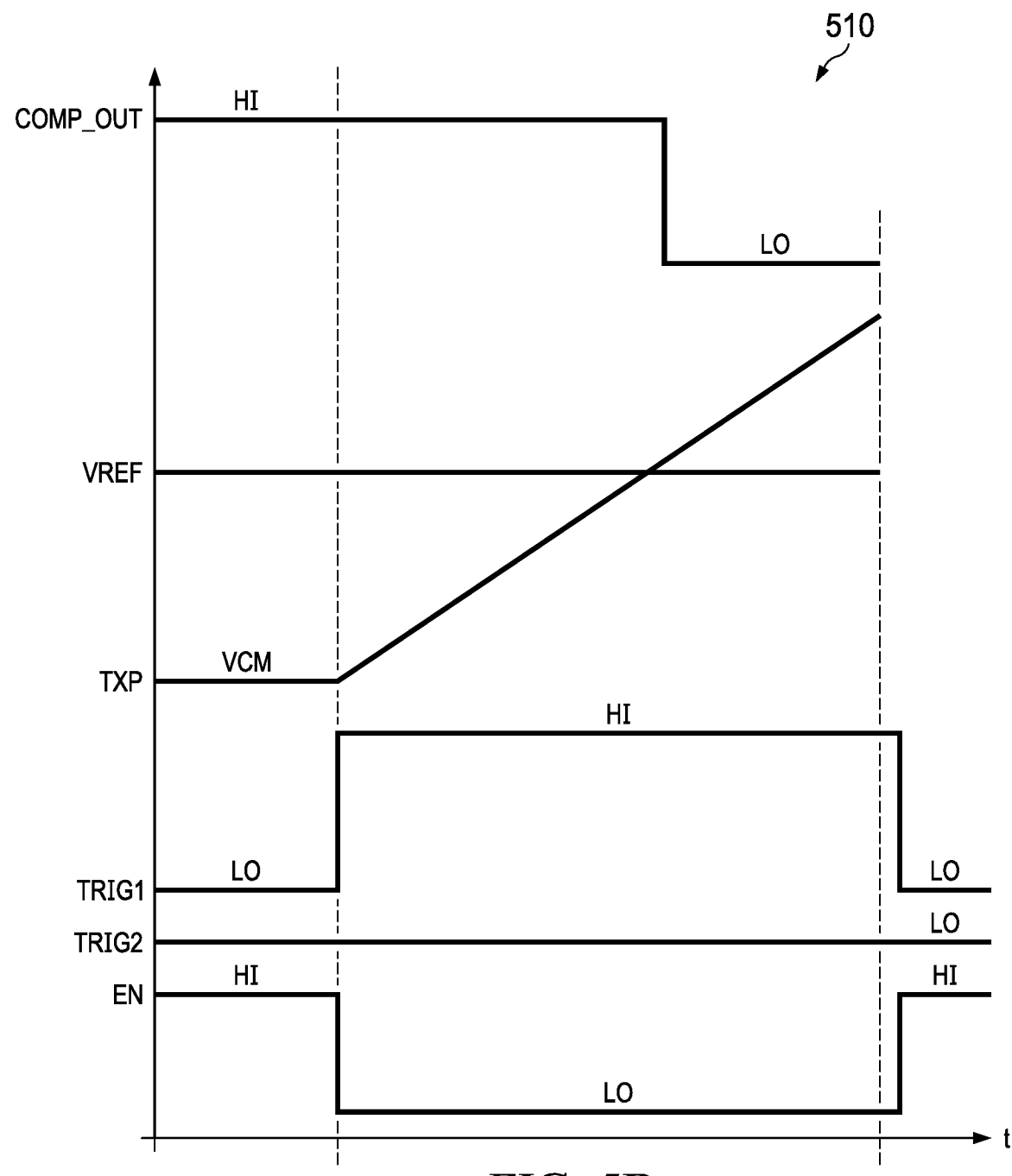
FIG. 5B shows a diagram of illustrative signal waveforms in accordance with various examples.

Turning now to FIGS. 5A and 5B, diagrams of illustrative signal waveforms are shown. In at least some examples, the diagram 505 is representative of at least some signals present in the system 100 of FIG. 1 and/or the circuit 400 of FIG. 4 when the positive conductor 116 is terminated with a valid termination or a short. Additionally, in at least some examples, the diagram 510 is representative of at least some signals present in the system 100 of FIG. 1 and/or the circuit 400 of FIG. 4 when the positive conductor 116 is in a high-Z state. Accordingly, at least some aspects of description of FIGS. 5A and/or 5B make reference to components and/or signals of FIG. 1 and/or FIG. 4. Furthermore, similar to the above discussion, FIGS. 5A and 5B are discussed with respect to the first output terminal 112, TXP, and the positive conductor 116. Waveforms for the second output terminal 114, a signal present at the second output terminal (referred to herein as TXN), and the negative conductor 118 are substantially similar to those illustrated in FIGS. 5A and 5B.

As shown in the diagram 505, when TRIG1 becomes asserted, TXP begins to increase in value. TRIG1 remains asserted for a predefined period of time determined at least partially according to values of VREF, VCM, and the resistance of the resistor 404. For example, TRIG1 remains asserted for a period of time sufficient to determine, based on a value of VCM and a value of TXP, whether the resistance of the resistor 404 is greater than or less than a resistance present on the positive conductor 116. The resistance present on the positive conductor 116 is less than the resistance of the resistor 404 when the positive conductor 116 is terminated, either in a short or with an expected termination resistance. When the resistance present on the positive conductor 116 is less than the resistance of the resistor 404, TXP remains less than VREF for a duration of time that TRIG1 is asserted and COMP_OUT remains de-asserted (in this example, at a logical high level, but in other examples at a logical low level).

As also shown in the diagram 510, when TRIG1 becomes asserted, TXP begins to increase in value. For example, as discussed elsewhere herein, a rate of increase in TXP after assertion of TRIG1 is dependent on a ratio of resistance of the resistor 404 to a resistance present on the positive conductor 116. In turn, also as discussed elsewhere herein, the rate of increase in TXP indicates whether or not a fault or high-Z state exists on the positive conductor 116. TRIG1 remains asserted for the predefined period of time, as discussed with reference to the diagram 505. The resistance present on the positive conductor 116 is greater than the resistance of the resistor 404 when the positive conductor 116 is in a high-Z state (e.g., is not terminated). When the resistance present on the positive conductor 116 is greater than the resistance of the resistor 404, TXP exceeds VREF prior to de-assertion of TRIG1 and COMP_OUT becomes asserted (in this example, set to a logical low level, but in other examples at a logical high level).

Figure 6A:
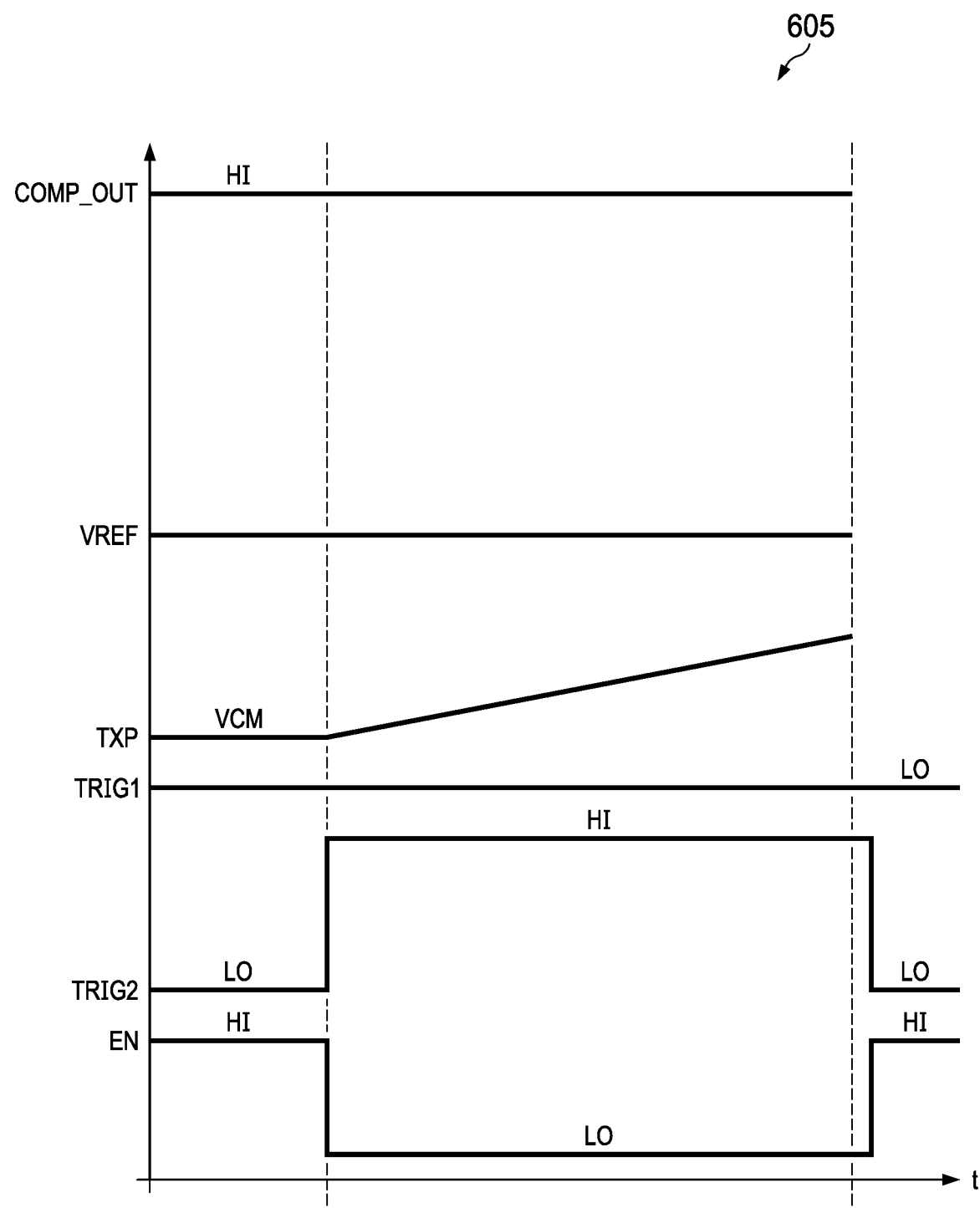
FIG. 6A shows a diagram of illustrative signal waveforms in accordance with various examples.
Figure 6B:
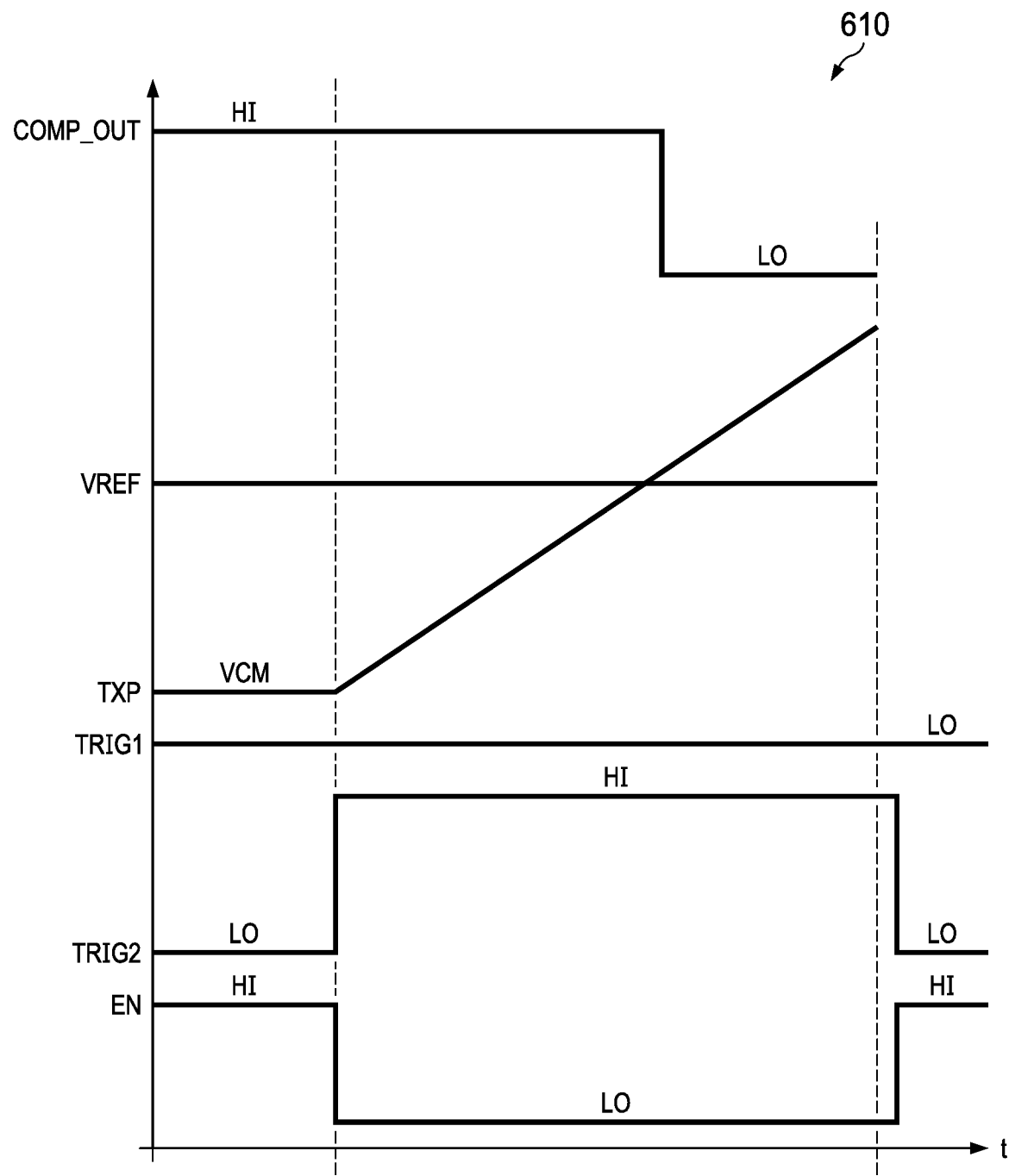
FIG. 6B shows a diagram of illustrative signal waveforms in accordance with various examples.

Turning now to FIGS. 6A and 6B, diagrams of illustrative signal waveforms are shown. In at least some examples, the diagram 605 is representative of at least some signals present in the system 100 of FIG. 1 and/or the circuit 400 of FIG. 4 when a short exists. Additionally, in at least some examples, the diagram 610 is representative of at least some signals present in the system 100 of FIG. 1 and/or the circuit 400 of FIG. 4 when no short exists (e.g., such as when a valid termination is present). Accordingly, at least some aspects of description of FIGS. 6A and/or 6B make reference to components and/or signals of FIG. 1 and/or FIG. 4. Furthermore, similar to the above discussion, FIGS. 6A and 6B are discussed with respect to the first output terminal 112, TXP, and the positive conductor 116. Waveforms for the second output terminal 114, a signal present at the second output terminal (referred to herein as TXN), and the negative conductor 118 are substantially similar to those illustrated in FIGS. 6A and 6B.

As shown in the diagram 605, when TRIG2 becomes asserted, TXP begins to increase in value. TRIG2 remains asserted for a predefined period of time determined at least partially according to values of VREF, VCM, and the resistance of the resistor 408. For example, TRIG2 remains asserted for a period of time sufficient to determine, based on a value of VCM and a value of TXP, whether the resistance of the resistor 408 is greater than or less than a resistance present on the positive conductor 116. The resistance present on the positive conductor 116 is less than the resistance of the resistor 408 when the positive conductor 116 is shorted to VDD or GND. When the resistance present on the positive conductor 116 is less than the resistance of the resistor 408, TXP remains less than VREF for a duration of time that TRIG2 is asserted and COMP_OUT remains de-asserted (in this example, at a logical high level, but in other examples at a logical low level).

As also shown in the diagram 610, when TRIG2 becomes asserted, TXP begins to increase in value. TRIG2 remains asserted for the predefined period of time, as discussed with reference to the diagram 605. The resistance present on the positive conductor 116 is greater than the resistance of the resistor 408 when the positive conductor 116 is validly terminated with a resistance greater than the resistance of the resistor 408 and/or is not shorted to VDD or GND. When the resistance present on the positive conductor 116 is greater than the resistance of the resistor 408, TXP exceeds VREF prior to de-assertion of TRIG2 and COMP_OUT becomes asserted (in this example, set to a logical low level, but in other examples at a logical high level).

Figure 7:
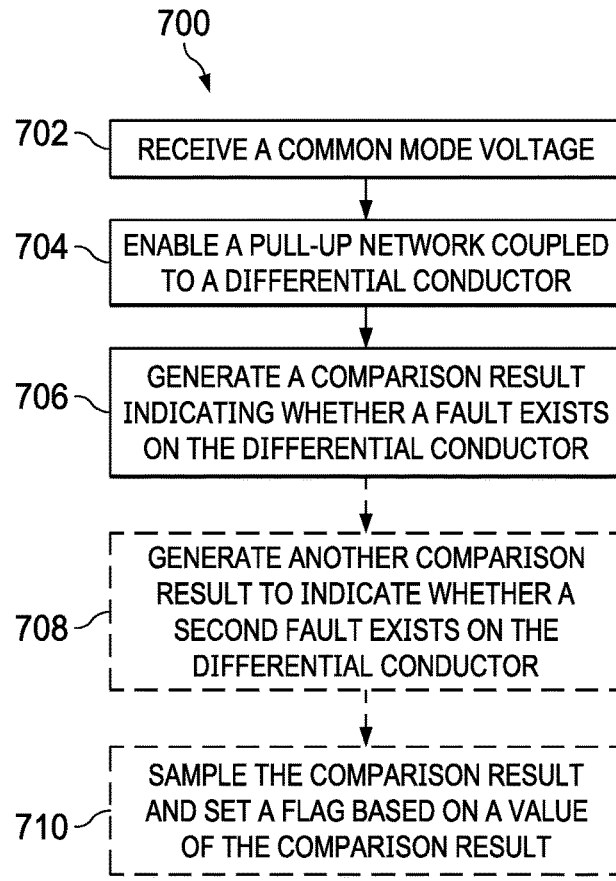
FIG. 7 shows a flowchart of an illustrative method of pinstrap detection in accordance with various examples.

Turning now to FIG. 7, a flowchart of an illustrative method 700 is shown. In at least some examples, the method 700 is a fault detection method. The method 700 is implemented, in some examples, by one or more electrical components to determine whether a fault or high-Z state exists in a conductor. The conductor is, in some examples, at least one of a pair of opposing polarity conductors in a differential conductor. In at least some examples, the method 700 is performed separately for both positive and negative conductors of a differential conductor. In this way, it is determinable whether one of the positive or negative conductors is experiencing a fault even when the other of the positive or negative conductors is validly terminated.

At operation 702, a common mode voltage is received. In at least some examples, the common mode voltage is received from a differential driver. The common mode voltage is, in at least some examples, output by the differential driver for transmission on a positive conductor or a negative conductor of a differential conductor. In other examples, the common mode voltage is used in determining a signal for transmission on the positive conductor or the negative conductor of the differential conductor. Generally, a transmission on a positive conductor or a negative conductor of a differential conductor is at least partially determined according to the received common mode voltage.

At operation 704, a pull-up network coupled to the differential conductor is enabled. In at least some examples, the pull-up network is enabled by coupling the differential conductor to VDD through a pull-up resistor and a switchable component that is active when the pull-up network is enabled and is inactive when the pull-up network is disabled. In at least some examples, the pull-up resistor has a resistance less than an expected termination resistance of the differential conductor but greater than a resistance that will be seen on the differential conductor when the differential conductor is shorted to VDD or GND.

At operation 706, a comparison result is generated indicating whether a fault or high-Z exists on the differential conductor. In at least some examples, such as in a single-step fault detection process, the comparison result indicates whether a short of the differential conductor, for example to VDD or GND, exists or whether the differential conductor is in a high-Z state. In at least some examples, the comparison result is generated by comparing a received VREF to a voltage present on the differential conductor after a predefined amount of time. For example, by activating the pull-up network, a voltage divider is formed having the pull-up resistor as a top resistance, a termination resistance of the conductor as a bottom resistance, and the differential conductor as an output point of the voltage divider. By comparing VREF to the voltage present on the differential conductor after the predefined amount of time, the comparison result indicates whether the top resistance or the bottom resistance is greater in value.

As discussed previously herein, in at least some examples one or more capacitors is coupled between the output point of the voltage divider and an impedance element providing the termination resistance, potentially modifying the bottom resistance from exactly reflecting the termination resistance. Further, in at least some examples the capacitor(s) alter a charging rate of the output point of the voltage divider.

However, because the capacitor(s) remain unchanging and only activation or de-activation of the pull-up network changes, the capacitors are not considered in the voltage divider discussed herein. For example, when the top resistance is greater in value than the bottom resistance, the voltage present on the differential conductor will be less than VREF at an expiration of the predefined amount of time. Conversely, when the top resistance is lesser in value than the bottom resistance, the voltage present on the differential conductor will be greater than VREF at an expiration of the predefined amount of time. When the voltage present on the differential conductor is greater than VREF at an expiration of the predefined amount of time the comparison result is asserted, indicating that the differential conductor is validly terminated (e.g., is not shorted to VND or GND).

In other examples, such as in a multi-step fault detection process, the comparison result indicates whether a high-Z state exists on the differential conductor. In this example, at a first step of the multi-step fault detection process the comparison result indicates whether the differential conductor is terminated or is in a high-Z state. The termination is either a valid termination (e.g., with an expected termination resistance) or a short. In at least some examples, the comparison result is again generated by comparing a received VREF to a voltage present on the differential conductor after a predefined amount of time. For example, by activating the pull-up network, a voltage divider is formed having the pull-up resistor as a top resistance, a termination resistance of the differential conductor as a bottom resistance, and the differential conductor as an output point of the voltage divider. By comparing VREF to the voltage present on the differential conductor after the predefined amount of time, the comparison result indicates whether the top resistance or the bottom resistance is greater in value. For example, when the top resistance is greater in value than the bottom resistance, the voltage present on the differential conductor will be less than VREF at an expiration of the predefined amount of time. Conversely, when the top resistance is lesser in value than the bottom resistance, the voltage present on the differential conductor will be greater than VREF at an expiration of the predefined amount of time. When the voltage present on the differential conductor is greater than VREF at an expiration of the predefined amount of time the comparison result is asserted, indicating that the differential conductor is in a high-Z state (e.g., is not terminated).

At operation 708, which is optional based on what form the operation 706 takes, another comparison result is generated indicating whether a fault exists on the differential conductor. In this example, at a second step of the multi-step fault detection process the comparison result indicates whether the differential conductor is terminated or is in a high-Z state. In at least some examples, the differential conductor being in the high-Z state indicates a fault on the differential conductor. In other examples, the differential conductor being in the high-Z state is merely informative, such as providing information that a component is not ready to receive data. The termination is either a valid termination (e.g., with an expected termination resistance) or a short. In at least some examples, the comparison result is again generated by comparing a received VREF to a voltage present on the differential conductor after a predefined amount of time. For example, by activating a another pull-up network, a second voltage divider is formed having a pull-up resistor of the another pull-up network as a top resistance, the termination resistance of the differential conductor as a bottom resistance, and the differential conductor as an output point of the voltage divider. By comparing VREF to the voltage present on the differential conductor after the predefined amount of time, the comparison result indicates whether the top resistance or the bottom resistance is greater in value. For example, when the top resistance is greater in value than the bottom resistance, the voltage present on the differential conductor will be less than VREF at an expiration of the predefined amount of time. Conversely, when the top resistance is lesser in value than the bottom resistance, the voltage present on the differential conductor will be greater than VREF at an expiration of the predefined amount of time. When the voltage present on the differential conductor is greater than VREF at an expiration of the predefined amount of time the comparison result is asserted, indicating that the differential conductor is validly terminated (e.g., is not shorted to VND or GND).

Additionally, in at least some examples the above operations 702 through 708 are manipulated to determine whether a short exists between positive and negative conductors of the differential conductor. For example, by controlling one of the positive or negative conductor to be in the high-Z state while the other of the positive or negative conductor is validly terminated, and then reversing the procedure, while monitoring the results for both configurations, a determination is made as to whether a short exists between the positive and negative conductors of the differential conductor. This procedure is discussed in greater detail above with respect to FIG. 1.

Optionally, the method 700 further includes operation 710. At operation 710, the comparison output is sampled and, based on a value of the comparison result, a value of an interrupt flag is set. In at least some examples, the sampling and setting is performed by a circuit having at least some processing or logic capability, such as a digital logic circuit. In some examples, the circuit is the same circuit that determines the predefined period of time that the pull-up network and/or the another pull-up network are enabled. In some examples, the interrupt flag is asserted when a fault is determined to exist on the conductor (e.g., when the comparison result has an asserted value) and is de-asserted otherwise.

While the operations of the method 700 have been discussed and labeled with numerical reference, in various examples the method 700 includes additional operations that are not recited herein. In some examples any one or more of the operations recited herein include one or more sub-operations (e.g., such as intermediary comparisons, logical operations, output selections such as via a multiplexer, format conversions, determinations, etc.). In some examples any one or more of the operations recited herein is omitted. In some examples any one or more of the operations recited herein is performed in an order other than that presented herein (e.g., in a reverse order, substantially simultaneously, overlapping, etc.). Each of these alternatives is intended to fall within the scope of the present disclosure.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, etc.), these components may be exchanged for components of other process technologies (e.g., replace FET and/or MOSFET with BJT, replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
an output adapted to be coupled to a conductor with an expected resistance;
a first pull-up network coupled between a voltage supply input and the output, the first pull-up network having a first resistance;
a second pull-up network coupled between the voltage supply input and the output, the second pull-up network having a second resistance; and
a comparator having a first input terminal coupled to the output, a second input terminal configured to receive a reference voltage, and an output terminal;
wherein the first resistance is less than the expected resistance and greater than a shorted conductor resistance, and
wherein the second resistance is greater than the expected resistance and less than a high-impedance resistance.

2. A circuit, comprising:
an output adapted to be coupled to a conductor with an expected resistance;
a first pull-up network adapted to be coupled to voltage supply and to the output and configured to include a first resistance;
a second pull-up network adapted to be coupled to the voltage supply and to the output and configured to include a second resistance; and
a comparator having a first input terminal coupled to the output, a second input terminal configured to receive a reference voltage, and an output terminal configured to output a comparison result;
wherein the circuit indicates a fault when the first resistance is greater than the resistance between the output and a ground terminal, and wherein the circuit indicates a high-impedance state exists when the second resistance is less than the resistance between the output and the ground terminal.

3. The circuit of claim 2, wherein the voltage for transmission is less than a reference voltage a predetermined period of time after the first pull-up network became active when the fault exists, and wherein the voltage for transmission is greater than the reference voltage a predetermined period of time after the second pull-up network became active when the high-impedance state exists.

4. A circuit, comprising:
an output adapted to be coupled to a conductor with an expected resistance;
a first pull-up network adapted to be coupled to a voltage supply and to the output and configured to include a first resistance;
a second pull-up network adapted to be coupled to the voltage supply and to the output and configured to include a second resistance; and
a comparator having a first input terminal coupled to the output, a second input terminal configured to receive a reference voltage, and an output terminal configured to output a comparison result;
wherein a fault exists when the first pull-up network is active and the voltage for transmission is less than a reference voltage a predetermined period of time after the first pull-up network became active, and wherein a high-impedance state further exists when the second pull- up network is active and the voltage for transmission is greater than the reference voltage a predetermined period of time after the second pull-up network became active.

5. The circuit of claim 4, wherein the first amount of resistance is less than the expected resistance and greater than a a short circuit resistance, and wherein the second resistance is greater than the expected resistance and less than a high-impedance resistance.

6. A circuit, comprising:
an output adapted to be coupled to a conductor with an expected resistance;
a first pull-up network coupled between a voltage supply input and the output, the first pull-up network having a first resistance;
a second pull-up network coupled between the voltage supply input and the output, the second pull-up network having a second resistance; and a comparator having a first input terminal coupled to the output, a second input terminal configured to receive a reference voltage, and an output terminal;

further comprising:

a first resistor coupled between the voltage supply input and a first node;

a second resistor coupled between the first node and the output; and an amplifier having a first input terminal coupled to the first node, a second input terminal configured to receive a common mode voltage associated with the differential conductor, and an output terminal coupled to the output.

7. The circuit of claim 6, wherein the first resistor, the second resistor, and the amplifier force a first output node to a value approximately equal to one-half of a value of a voltage present at the voltage supply input.

8. A method, comprising:

receiving a common mode voltage on which a transmission on a differential conductor is at least partially based;

enabling a first pull-up network coupled to the differential conductor;

generating a comparison result indicating a presence of a fault on the differential conductor, by comparing a voltage present at the differential conductor to a reference voltage after a first period of time, when a resistance of the pull-up network is greater than a resistance associated with the differential conductor; and generating the comparison result indicating no fault on the differential conductor, by comparing the voltage present at the differential conductor to the reference voltage, when the resistance of the pull-up network is less than the resistance associated with the differential conductor.

9. The method of claim 8, further comprising:

controlling the first pull-up network to be enabled for the first period of time; and sampling the comparison result at an end of the first period of time to determine a fault status of the differential conductor.

10. The method of claim 8, further comprising:

enabling a second pull-up network coupled to the differential conductor;

generating the comparison result indicating the presence of a high-impedance state on the differential conductor, by comparing the voltage present at the differential conductor to the reference voltage, when a resistance of the second pull-up network is lesser than the resistance associated with the differential conductor; and generating the comparison result indicating a termination of the differential conductor, by comparing the voltage present at the differential conductor to the reference voltage, when the resistance of the pull-up network is greater than the resistance associated with the differential conductor.

11. The method of claim 10, further comprising:

controlling the second pull-up network to be enabled for a second period of time; and sampling the comparison result at an end of the second period of time to determine a status of the differential conductor.

12. The method of claim 10, further comprising:

controlling a first polarity portion of the differential conductor to be in the high-impedance state and a second polarity portion of the differential conductor to be terminated by a valid termination;

determining whether the first polarity portion of the differential conductor is terminated;

when the first polarity portion of the differential conductor is determined to be terminated, controlling the first polarity portion of the differential conductor to be validly terminated and the second polarity portion of the differential conductor to be in the high-impedance state;

determining whether the second polarity portion of the differential conductor is terminated; and when the second polarity portion of the differential conductor is terminated, determining that a short exists between the first polarity portion of the differential conductor and the second polarity portion of the differential conductor.

13. A system, comprising:

a transmitter comprising a fault detection circuit that comprises:

an output;

a first pull-up network coupled between a voltage supply and the output;

a second pull-up network coupled between the voltage supply node and the output; and a comparator having a first input terminal coupled to the output, a second input terminal configured to receive a reference voltage, and an output terminal configured to output a comparison result;

a receiver comprising a termination circuit; and a differential conductor, comprising:

a positive conductor coupling the output to the receiver and configured to couple to the fault detection circuit and the termination circuit; and a negative conductor coupling the transmitter to the receiver and configured to couple to the fault detection circuit and the termination circuit.

14. The system of claim 13, wherein the fault detection circuit is configured to:

receive a common mode voltage on which a transmission on a differential conductor is at least partially based;

enable the first pull-up network;

generate a comparison result indicating a presence of a fault on the differential conductor, by comparing a voltage present at the differential conductor to a reference voltage, when a resistance of the first pull-up network is greater than a resistance associated with the differential conductor; and generate the comparison result indicating no fault on the differential conductor, by comparing the voltage present at the differential conductor to the reference voltage, when the resistance of the first pull-up network is less than the resistance associated with the differential conductor.

15. The system of claim 13, wherein the system is configured to:

control the termination circuit to maintain the positive conductor in a high-impedance state and terminate the negative conductor with a valid termination;

determine whether the positive conductor is terminated;

when the positive conductor is determined to be terminated, control the termination circuit to maintain the negative conductor in the high-impedance state and terminate the positive conductor with the valid termination;

determine whether the negative conductor is terminated; and when the negative conductor is terminated, determine that a short exists between the positive conductor and the negative conductor.

16. The system of claim 13, wherein the fault detection circuit is further configured to:
   enable the second pull-up network;
   generate the comparison result indicating the presence of a high-impedance state on the differential conductor, by comparing the voltage present at the differential conductor to the reference voltage, when a resistance of the second pull-up network is less than the resistance associated with the differential conductor; and
   generate the comparison result indicating a valid termination of the differential conductor, by comparing the voltage present at the differential conductor to the reference voltage, when the resistance of the pull-up network is greater than the resistance associated with the differential conductor.

17. The system of claim 13, wherein the fault detection circuit further comprises:
   a first resistor coupled between the voltage supply and a first node;
   a second resistor coupled between the first node and the output; and an amplifier having a first input terminal coupled to the first node, a second input terminal configured to receive a common mode voltage associated with the differential conductor, and an output terminal coupled to the output.

18. The system of claim 17, wherein the first pull-up network includes a resistance less than an expected termination resistance of the differential conductor and greater than a resistance present on the differential conductor when the differential conductor is shorted to the voltage supply or a ground, and wherein the second pull-up network includes a resistance greater than the expected termination resistance of the differential conductor and less than a resistance present on the differential conductor when the differential conductor is in a high-impedance state.

* * * * *